(12) United States Patent
Shih

(10) Patent No.: US 6,763,880 B1
(45) Date of Patent: Jul. 20, 2004

(54) LIQUID COOLED RADIATION MODULE FOR SERVERS

(75) Inventor: Shoei-Yuan Shih, Shijr (TW)

(73) Assignee: Evserv Tech Corporation, Taipei Hsien (TW)

(*) Notice: Subject to any disclaimer, the term of this patent is extended or adjusted under 35 U.S.C. 154(b) by 0 days.

(21) Appl. No.: 10/606,356

(22) Filed: Jun. 26, 2003

(51) Int. Cl.[7] .................................................. H05K 7/20
(52) U.S. Cl. ................. 165/80.4; 165/122; 165/104.22; 361/699
(58) Field of Search ............................. 165/80.3, 80.4, 165/104.22, 104.33, 104.34, 122, 185; 361/699

(56) References Cited

U.S. PATENT DOCUMENTS

| | | | | |
|---|---|---|---|---|
| 5,299,278 A | * | 3/1994 | Heller | 392/358 |
| 5,323,847 A | * | 6/1994 | Koizumi et al. | 165/104.33 |
| 5,940,270 A | * | 8/1999 | Puckett | 361/699 |
| 6,029,742 A | * | 2/2000 | Burward-Hoy | 165/80.4 |
| 6,166,907 A | * | 12/2000 | Chien | 361/699 |
| 6,208,512 B1 | * | 3/2001 | Goldowsky et al. | 361/699 |
| 6,327,145 B1 | * | 12/2001 | Lian et al. | 361/697 |
| 6,600,649 B1 | * | 7/2003 | Tsai et al. | 361/697 |
| 2003/0209343 A1 | * | 11/2003 | Bingler | 165/80.4 |

FOREIGN PATENT DOCUMENTS

WO  WO 01/65900 A1 * 2/2001 ............ H05K/7/20

* cited by examiner

Primary Examiner—Allen J. Flanigan
(74) Attorney, Agent, or Firm—Birch, Stewart, Kolasch & Birch, LLP

(57) ABSTRACT

A liquid cooled radiation module for servers is installed in a server to directly dissipate heat from a central processing unit through a liquid cooling fashion. The module includes a body which has a housing compartment to house a liquid tube and a radiator. The radiator has an air sucking section to draw heated air in the housing compartment and an air discharge section to discharge heat through an air vent. The liquid tube has a water delivery device driven magnetically by the radiator to form liquid circulation to continuously disperse heat from the CPU. The module thus made is compact and adaptable to servers of 1U or 2U specifications.

6 Claims, 6 Drawing Sheets

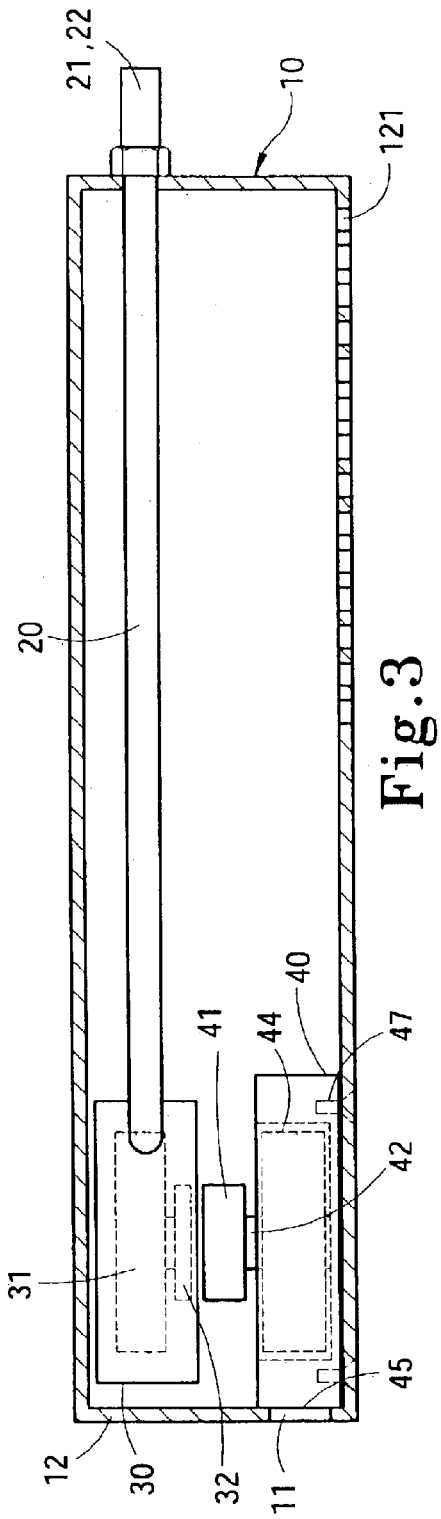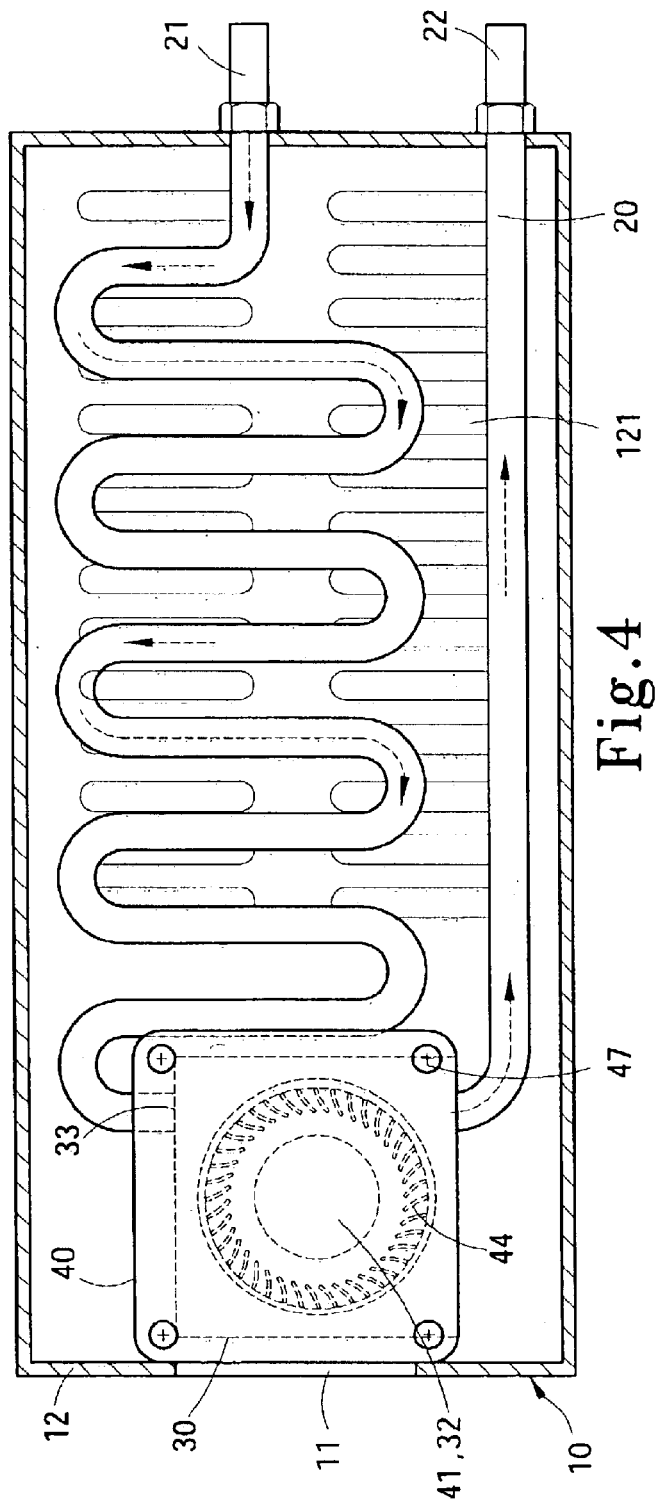

LIQUID COOLED RADIATION MODULE FOR SERVERS

FIELD OF THE INVENTION

The present invention relates to a liquid cooled radiation module for servers and particularly to a liquid cooled radiation module adopted for use on computer hosts housed in servers of general industrial 1U or 2U standards that otherwise are not suitable to apply liquid cooling due to space constraint.

BACKGROUND OF THE INVENTION

Concentration of central processor unit (CPU) has been grown constantly, and the frequency of CPU also increases as well. The heat being radiated is very hot and in some cases can even boil water. Following the existing trend, the present air cooled radiation fins cannot fully dissipate the thermal energy generated by the modern CPUs. Experts predict that in the future 3 to 5 years all CPUs in the world have to use liquid cooled apparatus. The liquid cooled apparatus have many advantages such as strong thermal energy carrying capability and desirable controllability. And thermal energy may be transferred in a selected direction. Liquid circulation may be achieved by a smaller amount of power consumption. Radiation may be accomplished in various forms. The curve of CPU operation temperature is smooth and formed in a gradual shape. And operation noise of the equipment is lower. Typical liquid cooled apparatus now available on the market can be summed up as follows:

1. External liquid cooled apparatus. It includes a water tank equipped with a pump located outside a computer host. The water tank is connected to the CPU through a water pipe. Heat generated by the CPU is carried by the liquid to the external water tank in a close loop manner. Heat dissipation is performed in the external water tank. This type of heat dissipation is most effective. However, the external water tank and the radiation module are quite bulky and take too much space. It is suitable only to large size computer hosts, and is not suitable to the general personal computers or servers.
2. Modular liquid cooled apparatus. Such type is designed based on 5.25" slot. The apparatus includes radiation fins made by aluminum extrusion and air fans. The radiation fins has four straight water passages on the bottom and two transverse water passages. The water passages are sealed by waterproof silicon paste to form a M-shaped water passage to allow water to circulate inside. It can increase contact surface and effectively transfer heat to the bottom of the radiation fins. However, as the fins have a lower height, the air fans experience a clear static pressure during operation. Such a design has the advantage of requiring only one optical disk slot. It is suitable for personal computers. However, to servers, because the space for hard disk and optical disk drive is limited, to allocate extra space is not easy. Hence for the servers that conform to industrial 1U or 2U standards, the liquid cooled apparatus that can be directly installed in the servers is still not available.
3. Moreover, liquid circulation of the present liquid cooled radiation modules mostly have a water delivery device connecting to a liquid pipe that is driven by a pump and motor. The pump and motor generate noise during operation. It is an annoyance not well accepted by many users.

SUMMARY OF THE INVENTION

Therefore the primary object of the invention is to resolve the aforesaid disadvantages and overcome the drawbacks of the prior art. The invention is installed in a server to directly provide liquid cooled heat dissipation for the CPU. The module includes a body which has a housing compartment to contain a liquid tube and a radiator. The radiator has an air sucking section to draws heated air in the housing compartment and an air discharge section to discharge through an air vent. The liquid tube includes a water delivery device to form a liquid circulation loop to continuously disperse heat for the CPU. The liquid cooled radiation module thus made is compact and may be adopted on servers of 1U or 2U standards, and coupled with the operation of the water delivery device which is driven synchronously by magnetic force of an impeller of the radiator, it can achieve heat dissipation effect through liquid circulation without the need of using a conventional, motor-driven pump.

The foregoing, as well as additional objects, features and advantages of the invention will be more readily apparent from the following detailed description, which proceeds with reference:to the accompanying drawings.

BRIEF DESCRIPTION OF THE DRAWINGS

FIG. 3 is a top view of the invention.

FIG. 4 is a schematic view of the-invention showing the flow direction of heat dissipation.

DETAILED DESCRIPTION OF THE PREFERRED EMBODIMENTS

Figure 1:
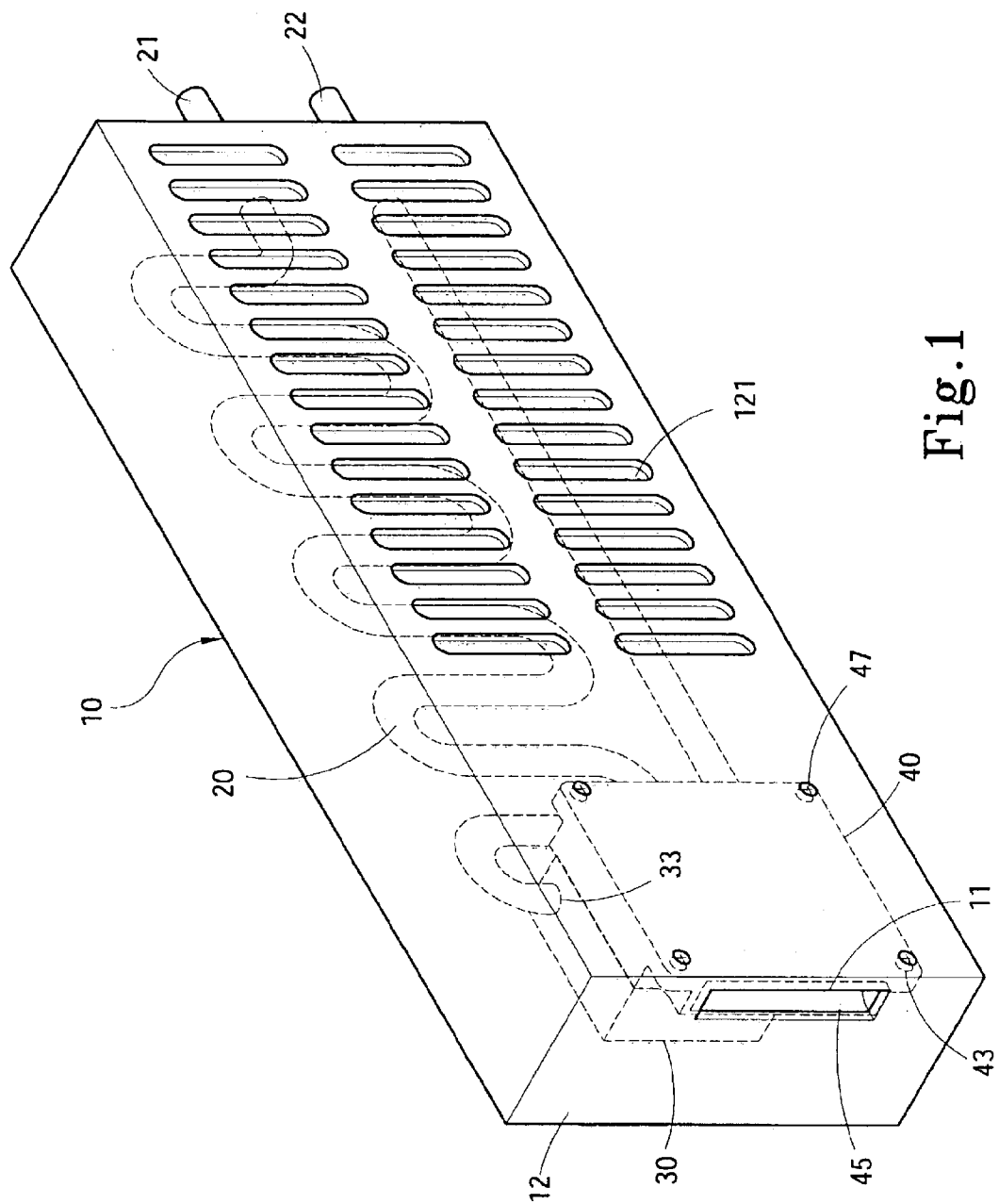
FIG. 1 is a perspective view of the invention.
Figure 2:
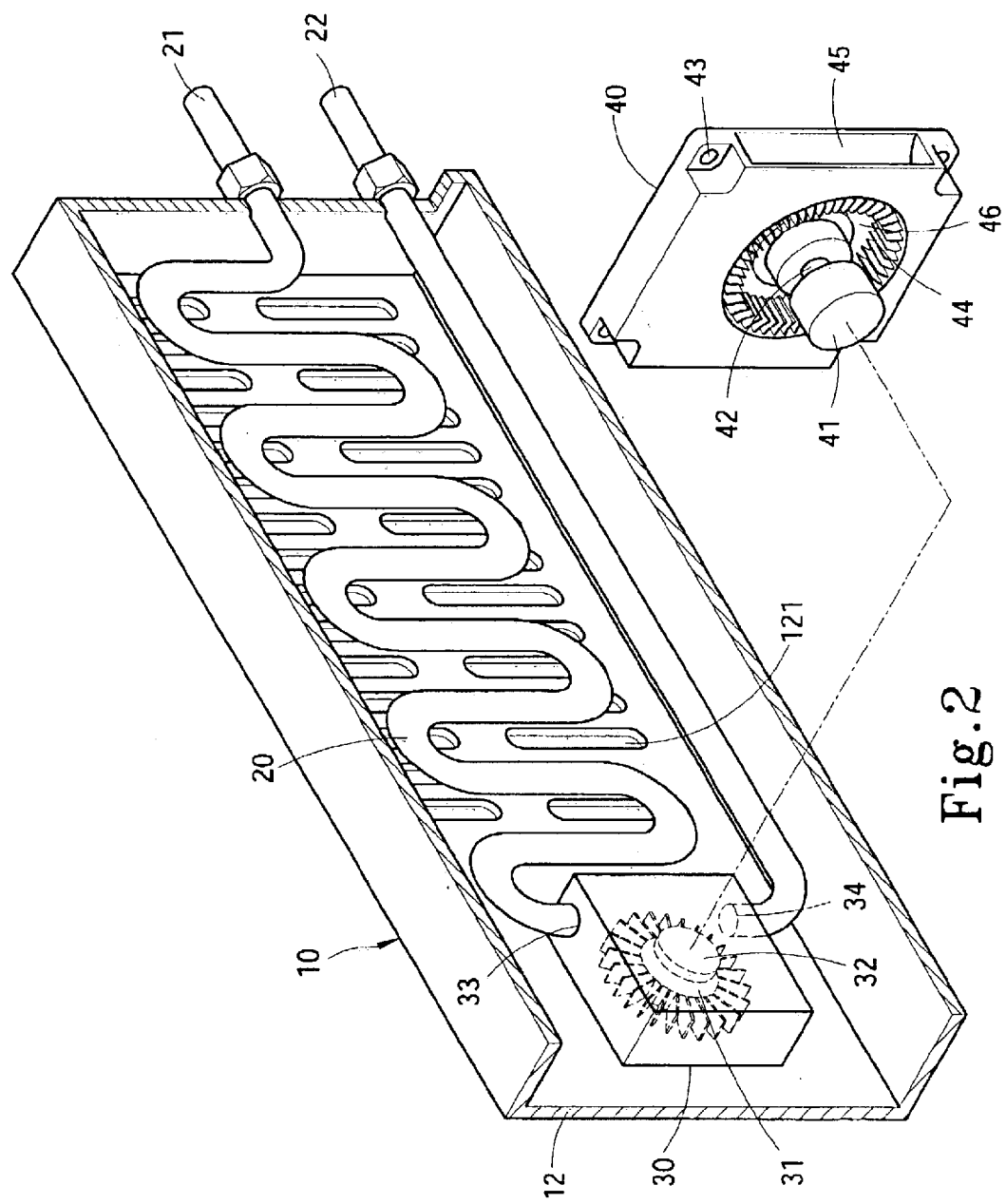
FIG. 2 is a sectional view of the invention.

Please referring to FIGS. 1 through 5, the liquid cooled radiation module for servers according to the invention is housed in a server 80 to directly disperse heat for a CPU 51 through a liquid cooling fashion. The module includes a body 10 which has a housing compartment, and one or more liquid tube 20 and radiator 40 located in the housing compartment. The body 10 has one end forming an air vent 11 communicating with the housing compartment. The radiator has an impeller 40 bordered by an air discharge section 45 to connect to the air vent 11 and an air sucking section 46 to draw heated air in the housing compartment. During assembly, one end of the radiator 40 has a fastening section 43 to fasten to a side wall 12 of the body 10 through fasteners 47. The liquid tube 20 is formed in a undulate manner to provide a greater amount of heat dissipation surface. The liquid tube 20 further has two ends 21 and 22 extended and exposed outside the body 10, and one or more water delivery device 30 located therein. The water delivery device 30 is a closed body corresponding to where the radiator 40 is located. The water delivery device 30 also has a liquid inlet 33 and a liquid outlet 34 connecting to the liquid tube 20. Inside the water delivery device 30, there is a water delivery member 31 corresponding to the impeller 44 of the radiator 40 and driven by the impeller 44 through a magnetic force. The liquid cooled radiation module thus made can achieve heat dissipation through liquid circulation without using a conventional, motor-driven pump.

In terms of the server 80 that adopts the general industrial standards 1U or 2U, it has a common specification for height of 1.75". After a main board 50 and the CPU 51 and the radiator have been installed in the server 80, there is not spare height to accommodate the radiator 40. Hence the server 80 usually has to allocate a middle section to install an array of air fans (not shown in the drawings) for heat dissipation. Therefore, in the limited interior space of the server 80, the invention uses the space between the power supply 70 and the main board 50 to install the liquid cooled radiation module, and installation is done in a upright manner to use the space effectively.

Figure 5:
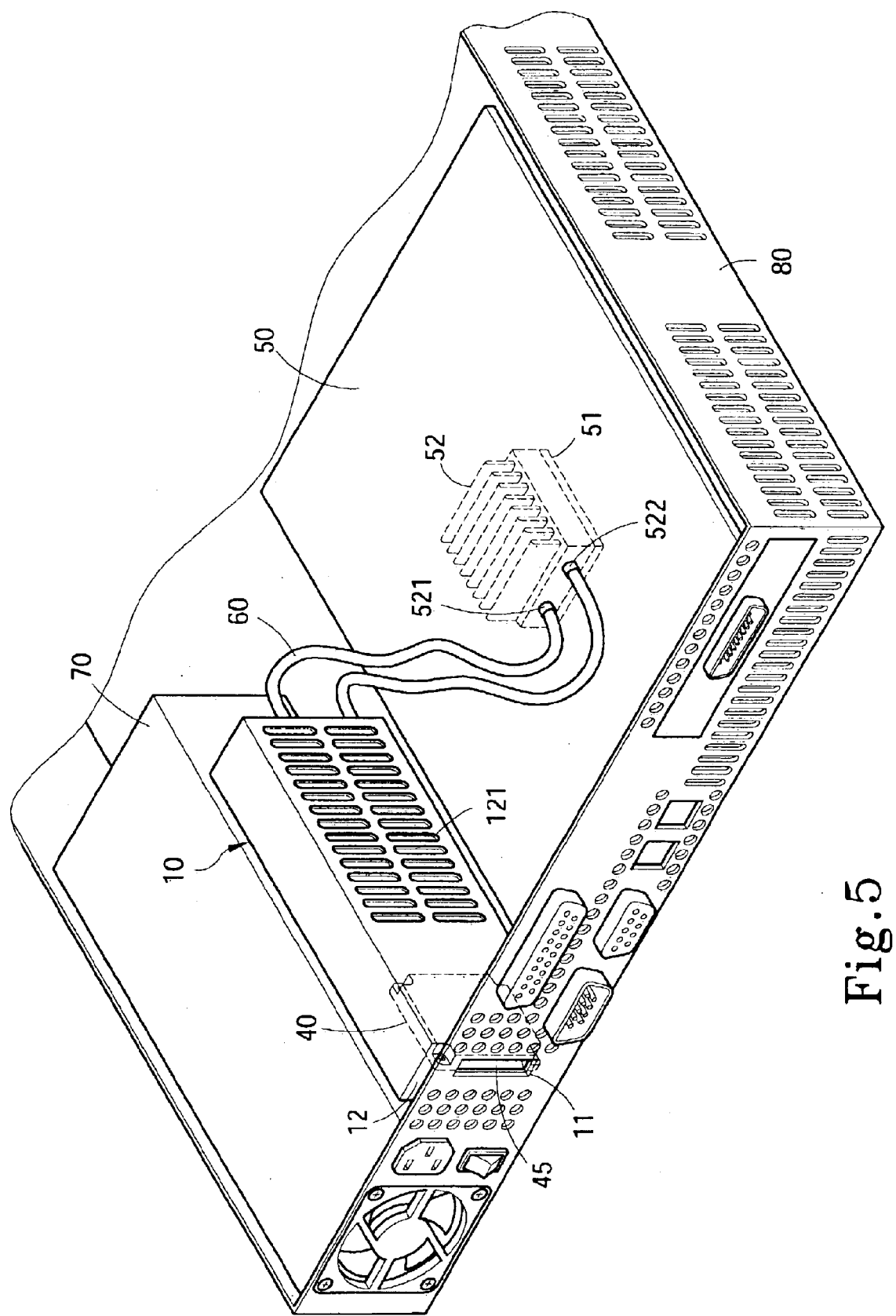
FIG. 5 is an illustrative view of the invention installed in a server.
Figure 6:
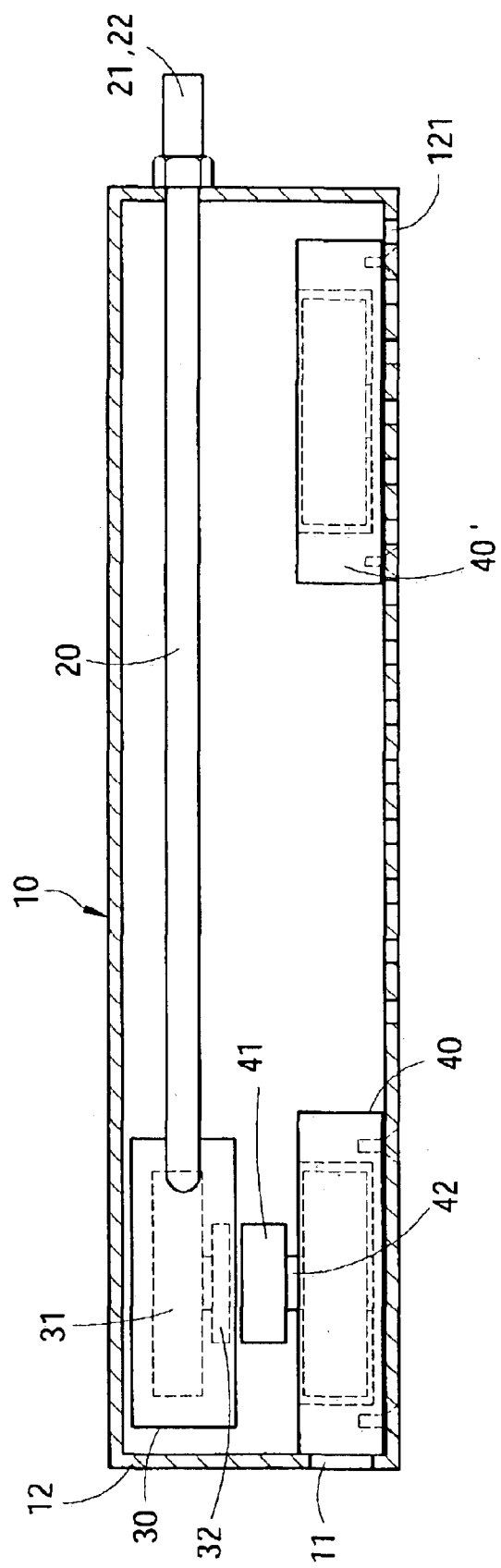
FIGS. 6 and 7 are schematic views of another embodiment of the invention.
Figure 7:
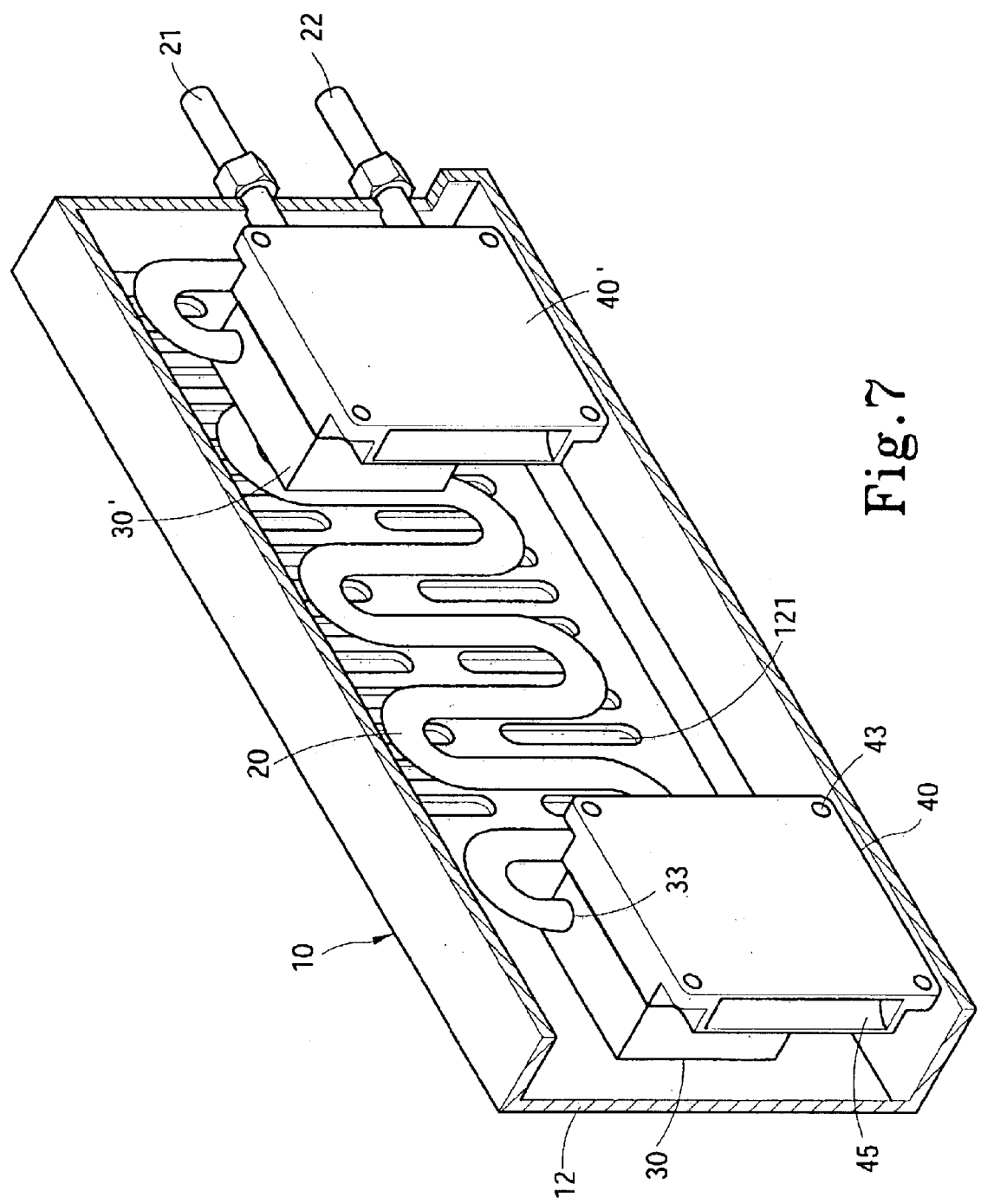

Referring to FIGS. 4 and 5, when in use, water pipes 60 are used to connect a water inlet head 522 and a water outlet head 521 of the radiation fins 52 above the CPU 51, and connect to two ends 21 and 22 of the liquid tube 20. When the radiator 40 starts operation, the impeller 44 has a coaxial rotary shaft 42 coupling with a first magnetic member 41. The water delivery device 30 has a second magnetic member 32 corresponding to the first magnetic member 41 with the same or opposite magnetism. According the magnetic principle of attraction of opposite magnetism or repulsion of the same magnetism, when the first magnetic member 41 rotates with the impeller 44, the second magnetic member 32 also is driven to rotate and the water delivery member 31 is driven to pump water. As the liquid tube 20 and the water pipe 60 are formed in a closed loop, water can be circulated by entering from the liquid inlet 33 of the water delivery device 30 and discharging through the liquid outlet 34 under the thrust force generated by the water delivery member 31 (by the same principle of a water wheel). Meanwhile, liquid in the liquid tube 20 flows through the water inlet head 522 of the radiation fins 52 to absorb thermal energy of the CPU 51 and exit through the water outlet head 521 and return to another end 21 into the liquid tube 20. As the liquid tube 20 is formed in a undulate manner, heat dissipation surface is enlarged. With the impeller 44 of the radiator 40 rotating, and the side wall 12 of the body 10 has air intake openings 121 formed thereon, air in the housing compartment may be ventilated to accelerate airflow which enters from the air sucking section 46 of the radiator 40 and discharges through the air discharge section 45 and the air vent 11 thereby disperse heat from the liquid tube 20 to the exterior. Referring to FIG. 6, in order to increase heat dissipation effect, more than two sets of radiator 40 may be used. Namely, two sets of radiators 40 and 40' are installed on two ends of the body 10. The radiator 40' is mainly to carry external airflow into the body 10 to accelerate airflow speed and discharge from the radiator 40. Referring to FIG. 7, two sets of water delivery devices 30 and 30' may be coupled with two sets of radiators 40 and 40' to further accelerate liquid flow speed. Thereby thermal energy of the CPU 51 may be carried away faster to the liquid tube 20 and discharged rapidly through the radiators 40 and 40'.

By means of the construction set forth above, liquid in the radiators 40 and 40', coupled with the operation of the water delivery device 30, can continuously and rapidly carry the thermal energy generated by the CPU 51 to the liquid tube 20, and the radiators 40 and 40' can rapidly discharge the thermal energy through the liquid tube 20 to the exterior.

Thus the invention can effectively disperse heat of the CPU 51 through a liquid cooling fashion. Moreover, the whole module may be made in a compact size to better use the interior space of the server 80. And the server 80 that adopts the general industrial 1U or 2U standards can enjoy the benefits of liquid cooling apparatus. In addition, the invention does not need a conventional, motor-driven pump.

The impeller 44 of the radiator 40 is directly driven through magnetism. Not only fabrication cost may be reduced, operation noise also is lower. Furthermore, the water delivery device 30 is closed, liquid does not leak out or evaporated. Hence even though the invention is installed in the server 80, the electronic elements do not expose to moisture and do not have the risk of short circuit or damage.

What is claimed is:

1. A liquid cooled radiation module for servers installed in a server to directly dissipate heat for a central processing unit through a liquid cooling fashion, the module comprising:

a body having a housing compartment and an air vent located on one end thereof communicating with the housing compartment;

at least one liquid tube located in the housing compartment having two ends extended and exposed outside the body and at least one water delivery device located therein; and at least one radiator located in the housing compartment having an impeller which borders an air discharge section connecting to the air vent and an air sucking section for drawing heated air in the housing compartment;

wherein the water delivery device is a closed body corresponding to where the radiator is located and has a liquid inlet and a liquid outlet connecting to the liquid tube and a water delivery member corresponding to the impeller of the radiator and driven magnetically by the impeller such that the liquid cooled radiation module performs heat dissipation through liquid circulation.

2. The liquid cooled radiation module of claim 1, wherein the liquid tube is formed in a undulate fashion to increase heat dissipation area.

3. The liquid cooled radiation module of claim 1, wherein the impeller has an extended coaxial shaft to couple with a first magnetic member, the water delivery member having a second magnetic member corresponding to the first magnetic member and having a magnetism same or opposite the first magnetic member.

4. The liquid cooled radiation module of claim 1, wherein the body has a side wall forming air intake openings.

5. The liquid cooled radiation module of claim 1, wherein the radiator has a fastening section on one end to fasten to a side wall of the body through fasteners.

6. The liquid cooled radiation module of claim 1, wherein the server conforms to universal industrial specifications 1U or 2U.

* * * * *